(12) United States Patent
Dams et al.

(10) Patent No.: US 10,191,392 B2
(45) Date of Patent: Jan. 29, 2019

(54) ACTUATOR, POSITIONING DEVICE, LITHOGRAPHIC APPARATUS, AND METHOD FOR MANUFACTURING AN ACTUATOR

(71) Applicant: ASML Netherlands B.V., Veldhoven (NL)

(72) Inventors: Johannes Adrianus Antonius Theodorus Dams, Veldhoven (NL); Dirk Hendrikus Marinus Engelen, Leende (NL); Peter Michel Silvester Maria Heijmans, Weert (NL); Simon Bernardus Cornelis Maria Martens, Waalre (NL); Hans Butler, Best (NL); Antonius Franciscus Johannes De Groot, Someren (NL)

(73) Assignee: ASML Netherlands B.V., Veldhoven (NL)

( * ) Notice: Subject to any disclaimer, the term of this patent is extended or adjusted under 35 U.S.C. 154(b) by 39 days.

(21) Appl. No.: 15/324,264

(22) PCT Filed: Jul. 10, 2015

(86) PCT No.: PCT/EP2015/065858
§ 371 (c)(1),
(2) Date: Jan. 5, 2017

(87) PCT Pub. No.: WO2016/005568
PCT Pub. Date: Jan. 14, 2016

(65) Prior Publication Data
US 2017/0199469 A1    Jul. 13, 2017

(30) Foreign Application Priority Data

Jul. 11, 2014  (EP) .................................. 14176747
Feb. 16, 2015  (EP) .................................. 15155240

(51) Int. Cl.
*G03F 7/20* (2006.01)
*H02K 41/03* (2006.01)
(Continued)

(52) U.S. Cl.
CPC ......... *G03F 7/70758* (2013.01); *H02K 11/21* (2016.01); *H02K 11/30* (2016.01);
(Continued)

(58) Field of Classification Search
CPC .... G03F 7/70758; H02K 11/21; H02K 11/30; H02K 15/06; H02K 2201/18; H02K 41/031
See application file for complete search history.

(56) References Cited

U.S. PATENT DOCUMENTS 4,912,746 A * 3/1990 Oishi ................... H02K 41/031
                                                          310/12.01
6,831,379 B2   12/2004 Ohto et al.
(Continued)

FOREIGN PATENT DOCUMENTS

| | | |
|---|---|---|
| CN | 102545537 A | 7/2012 |
| JP | 61-124258 | 6/1986 |
| JP | 2006-129546 | 5/2006 |

OTHER PUBLICATIONS

International Search Report and Written Opinion dated Sep. 10, 2015 in corresponding International Patent Application No. PCT/EP2015/065858.

*Primary Examiner* — Deoram Persaud
(74) *Attorney, Agent, or Firm* — Pillsbury Winthrop Shaw Pittman LLP

(57) ABSTRACT

An actuator includes coil assemblies arranged in an array, wherein each coil assembly defines a core chamber having a core chamber height; and at least one magnetic member that extends partly along the core chamber height of the core (Continued)

chamber of a corresponding at least one coil assembly, wherein the at least one magnetic member is made of a magnetic material. A shape of the at least one magnetic member, a size of the at least one magnetic member, a position of the at least one magnetic member and/or the magnetic material of the at least one magnetic member may be selected so as to control one or more parameters of the actuator.

24 Claims, 9 Drawing Sheets

(51) Int. Cl.
*H02K 11/21* (2016.01)
*H02K 11/30* (2016.01)
*H02K 15/06* (2006.01)

(52) U.S. Cl.
CPC ........... *H02K 15/06* (2013.01); *H02K 41/031* (2013.01); *H02K 2201/18* (2013.01)

(56) References Cited

U.S. PATENT DOCUMENTS

| | | | | |
|---|---|---|---|---|
| 7,656,062 | B2* | 2/2010 | Binnard | G03F 7/70758 310/12.05 |
| 8,384,252 | B2* | 2/2013 | Kakihara | H02K 41/031 310/12.24 |
| 2003/0098620 | A1 | 5/2003 | Ohto et al. | |
| 2006/0139617 | A1* | 6/2006 | Dams | F16C 29/025 355/75 |
| 2006/0232145 | A1 | 10/2006 | Binnard et al. | |
| 2011/0057755 | A1* | 3/2011 | Dams | G03F 7/70758 335/289 |
| 2011/0259102 | A1* | 10/2011 | Dams | G01P 3/52 73/514.39 |

* cited by examiner

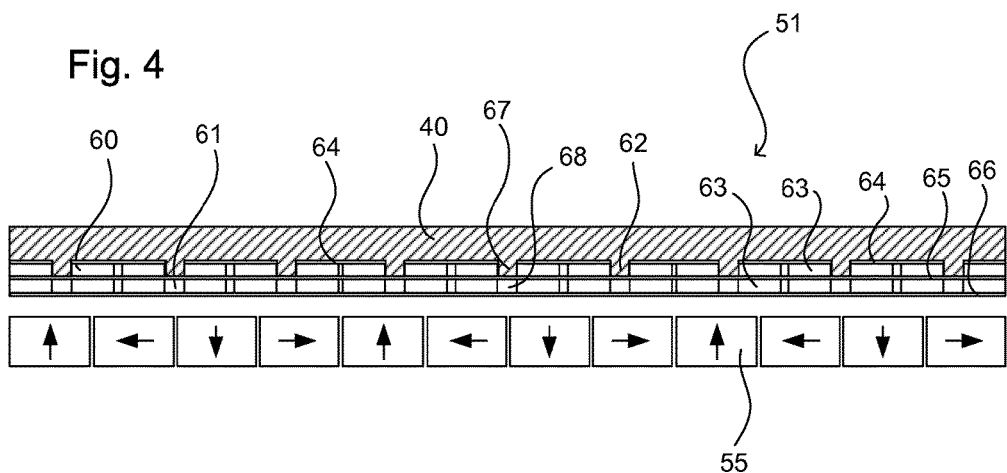
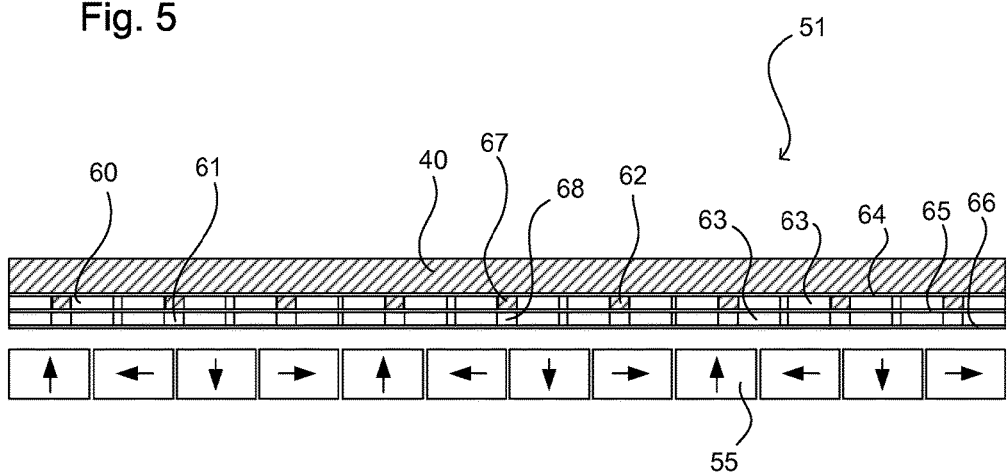
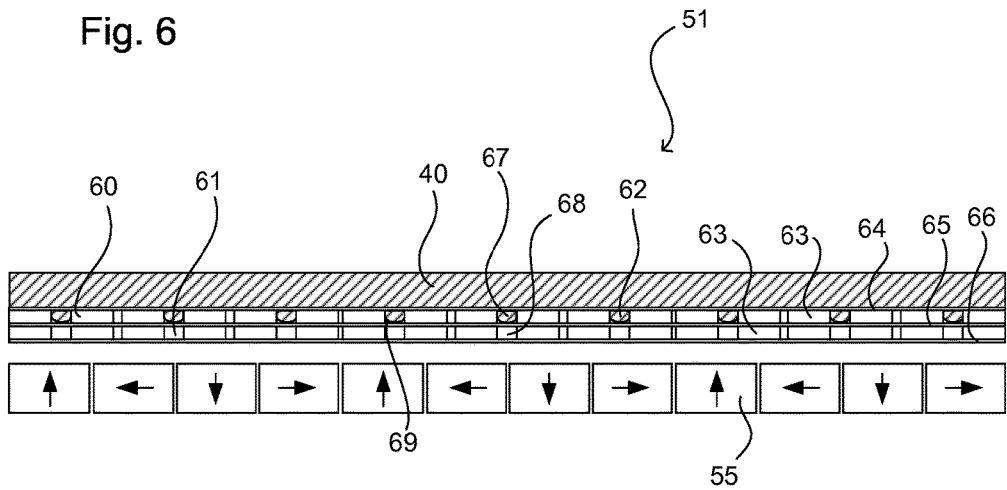

Φ [DEG]

ACTUATOR, POSITIONING DEVICE, LITHOGRAPHIC APPARATUS, AND METHOD FOR MANUFACTURING AN ACTUATOR

CROSS-REFERENCE TO RELATED APPLICATIONS

This application is the U.S. national phase entry of PCT patent application no. PCT/EP2015/065858, which was filed on Jul. 10, 2015, which claims the benefit of priority of European patent application no. 14176747.5, which was filed on Jul. 11, 2014, and European patent application no. 15155240.3, which was filed on Feb. 16, 2015 which are incorporated herein in their entirety by reference.

FIELD

The present invention relates to an actuator, a positioning device, a lithographic apparatus, and a method for manufacturing an actuator.

BACKGROUND

A lithographic apparatus is a machine that applies a desired pattern onto a substrate, usually onto a target portion of the substrate. A lithographic apparatus can be used, for example, in the manufacture of integrated circuits (ICs).

A patterning device may be supported by a mask support structure. In use of the lithographic apparatus, the mask support structure may be driven by a positioning device. The positioning device comprises an actuator having a magnet array and coils. It is desirable for the positioning device to be able to achieve acceleration levels as high as possible. However, due to limited force density (i.e. the ratio of force produced by the actuator to mass of the actuator), the mass of the actuator increases with increasing acceleration levels achieved by the actuator. Furthermore, it is desirable for parasitic forces and torques produced by the actuator to be as low as possible. A parasitic force is a force produced by the actuator that is different from the positioning force that the actuator is intended to provide. A parasitic force can reduce the accuracy of the positioning device.

It is desirable to increase the force density of an actuator for a given level of parasitic forces.

SUMMARY

According to an aspect of the invention, there is provided an actuator comprising: coil assemblies arranged in an array, wherein each coil assembly defines a core chamber having a core chamber height; and at least one magnetic member that extends partly along the core chamber height of the core chamber of a corresponding at least one coil assembly, wherein the at least one magnetic member is made of a magnetic material.

According to an aspect of the invention, there is provided a method for manufacturing an actuator comprising: defining a core chamber with each of a plurality of coil assemblies, wherein each core chamber has a core chamber height; arranging the coil assemblies in an array; and providing each core chamber with at least one magnetic member made of a magnetic material such that the magnetic member extends partly along the core chamber height of the core chamber.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3 to 9 each depict an embodiment of an actuator according to the invention.

DETAILED DESCRIPTION

Figure 1:
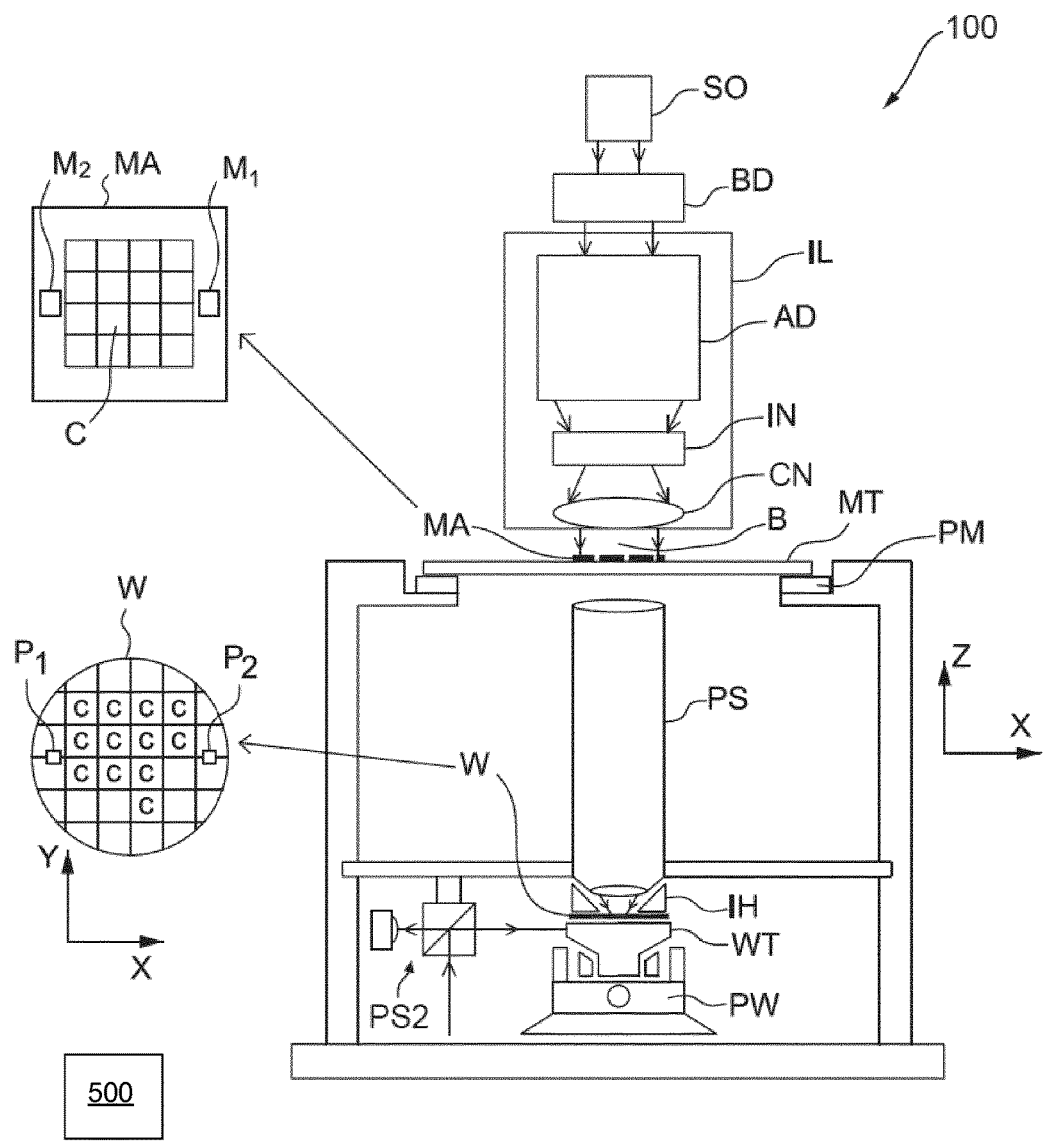
FIG. 1 depicts a lithographic apparatus according to an embodiment of the invention.

FIG. 1 schematically depicts a lithographic apparatus 100 according to an embodiment of the invention. The lithographic apparatus 100 includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device MA in accordance with certain parameters. The lithographic apparatus 100 also includes a substrate table (e.g. a wafer table) WT constructed to hold a substrate (e.g. a resist coated wafer) W and connected to a second positioning device PW configured to accurately position the substrate W in accordance with certain parameters. The lithographic apparatus 100 further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. The mask support structure MT holds the patterning device MA in a manner that depends on the orientation of the patterning device MA, the design of the lithographic apparatus 100, and other conditions, such as for example whether or not the patterning device MA is held in a vacuum environment. The mask support structure MT can use mechanical, vacuum, electrostatic or other clamping techniques to hold the patterning device. The mask support structure MT may be a frame or a table, for example, which may be fixed or movable as required. The mask support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart the radiation beam B with a pattern in its cross-section so as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The illumination system IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may include various other components, such as an integrator IN and a condenser CN. The illumination system IL may be used to condition the radiation beam B, to have a desired uniformity and intensity distribution in its cross section. The illumination system IL may or may not be considered to form part of the lithographic apparatus 100. For example, the illumination system IL may be an integral part of the lithographic apparatus 100 or may be a separate entity from the lithographic apparatus 100. In the latter case, the lithographic apparatus 100 may be configured to allow the illumination system IL to be mounted thereon. Optionally, the illumination system IL is detachable and may be separately provided (for example, by the lithographic apparatus manufacturer or another supplier).

As here depicted, the lithographic apparatus 100 is of a transmissive type (e.g. employing a transmissive mask). Alternatively, the lithographic apparatus 100 may be of a reflective type (e.g. employing a programmable mirror array of a type as referred to above, or employing a reflective mask).

The lithographic apparatus 100 may be of a type having two (dual stage) or more substrate tables WT (and/or two or more mask support structures MT, e.g. mask tables). In such a "multiple stage" lithographic apparatus 100 the additional substrate tables WT and/or mask support structures MT may be used in parallel, or preparatory steps may be carried out on one or more substrate tables WT and/or mask support structures MT while one or more other substrate tables WT and/or mask support structures MT are being used for exposure.

The patterning device MA is held on the mask support structure MT. The radiation beam B is incident on the patterning device MA. The radiation beam B is patterned by the patterning device MA. After being reflected from the patterning device MA, the radiation beam B passes through the projection system PS. The projection system PS focuses the radiation beam B onto a target portion C of the substrate W. The first positioner PM and a first position sensor (e.g., an interferometric device, linear encoder or capacitive sensor) can be used to accurately position the patterning device MA with respect to the path of the radiation beam B. The first position sensor is not explicitly shown in FIG. 1. With the aid of the second positioner PW and a second position sensor PS2 (e.g., an interferometric device, linear encoder or capacitive sensor), the substrate table WT can be moved accurately, e.g., so as to position different target portions C in the path of the radiation beam B.

In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. The patterning device MA may be aligned using mask alignment marks $M_1$, $M_2$. The substrate W may be aligned using substrate alignment marks $P_1$, $P_2$. Although the substrate alignment marks $P_1$, $P_2$ as illustrated occupy dedicated target portions C, they may be located between target portions C (these are known as scribe-lane alignment marks). Similarly, in situations in which more than one die is provided on the patterning device MA, the mask alignment marks $M_1$, $M_2$ may be located between the dies.

Immersion techniques can be used to increase the numerical aperture NA of the projection system PS. As depicted in FIG. 1, in an embodiment the lithographic apparatus 100 is of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus 100, for example, between the patterning device MA and the projection system PS. The term "immersion" as used herein does not mean that a structure, such as the substrate W, must be submerged in liquid, but rather only means that a liquid is located between the projection system PS and the substrate W during exposure.

Referring to FIG. 1, the illuminator IL receives a radiation beam from a source module SO. The source module SO and the lithographic apparatus 100 may be separate entities, for example when the source module SO is an excimer laser. In such cases, the source module SO is not considered to form part of the lithographic apparatus 100 and radiation is passed from the source module SO to the illumination system IL with the aid of a beam delivery system BD. In an embodiment the beam delivery system BD includes, for example, suitable directing mirrors and/or a beam expander. In other cases the source module SO may be an integral part of the lithographic apparatus 100, for example when the source module SO is a mercury lamp. The source module SO and the illumination system IL, together with the beam delivery system BD if required, may be referred to as a radiation system.

Arrangements for providing liquid between a final element of the projection system PS and the substrate W can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

As depicted in FIG. 1 the liquid supply system is provided with a liquid confinement structure IH which extends along at least a part of a boundary of the space between the final element of the projection system PS and the substrate W, substrate table WT or both.

In an embodiment the lithographic apparatus 100 comprises at least one actuator 51. The actuator 51 is configured to change the position of a component such as the mask support structure MT. As mentioned above, the first positioner PM is configured to change the position of the mask support structure MT. In an embodiment the first positioner PM comprises the actuator 51. In an embodiment, the actuator 51 is configured to change the orientation and/or position of the mask support structure MT. In an embodiment the actuator 51 is configured to move the mask support structure MT throughout the X-Y plane and in the Z-direction. Here, the Z-direction means the vertical direction.

In an embodiment, the actuator 51 further performs the function of the second positioner PW configured to change the position of the substrate table WT. In an embodiment the actuator 51 is in addition to the first positioner PM and the second positioner PW.

In an embodiment the lithographic apparatus 100 comprises a controller 500. The controller 500 is configured to control the actuator 51 based on measurements made by sensors (not shown). In an embodiment the controller 500 is configured to control the actuator 51 to position the mask support structure MT such that the mask support structure MT has a desired position within the lithographic apparatus 100.

In an embodiment a magnet array 55 is fixed to the component, e.g. mask support structure MT, that is positioned by the actuator 51. The actuator 51 comprises coil assemblies 60 facing the magnet array 55. The actuator 51 comprises the coil assemblies 60 and the magnet array 55. In an embodiment the coil assemblies 60 are arranged in an array and are substantially parallel to the magnet array 55 that is fixed to the mask support structure MT. However, it is not necessary for the magnet array 55 to be fixed to the component that is positioned by the actuator 51. For example, in an embodiment the coil assemblies 60 may be fixed to the component such as the mask support structure MT. In this case the magnet array 55 may be positioned below the actuator 51 so as to face the coil assemblies 60. Which of the actuator 51 and the magnet array 55 is fixed to the component to be positioned may be selected depending on the context. The designer can choose if he wants to 1) connect the magnet array 55 to the component to be positioned (magnet array moves and coil assemblies are stationary) or 2) connect the coil assemblies 60 to the component to be positioned (coil assemblies move and magnet array is stationary).

The actuator 51 of the present invention can be applied for positioning of the mask support structure MT, or to other structures of the lithographic apparatus 100. In the description below, the present invention will be described primarily with reference to a patterning device MA on a mask support structure MT being driven in a lithographic apparatus 100. The present invention is not limited to the context of positioning the patterning device MA and the mask support structure MT. For example, the present invention can be applied to positioning of the substrate table WT that supports the substrate W.

Figure 2:
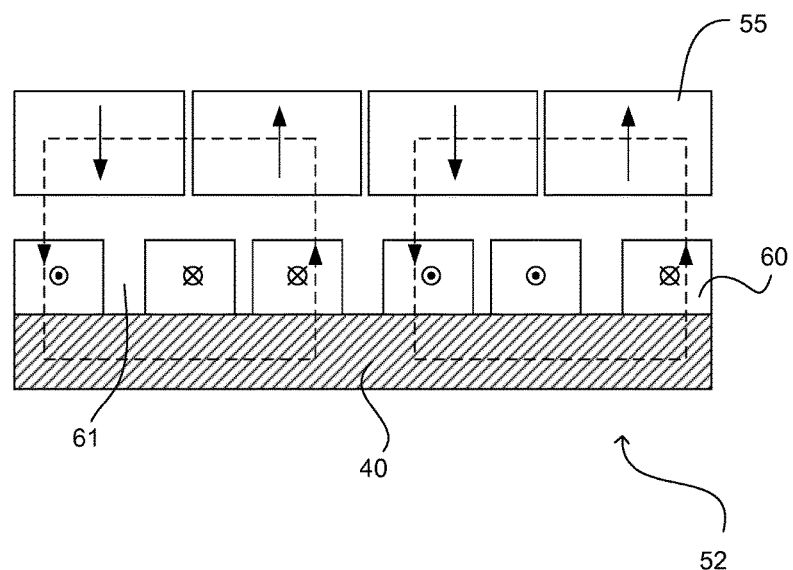
FIG. 2 depicts a prior art actuator.

FIG. 2 depicts a prior art actuator 52. The prior art actuator 52 depicted in FIG. 2 is part of a Lorentz moving magnet system. As depicted in FIG. 2, the Lorentz moving magnet prior art actuator 52 comprises a magnet array 55, coil assemblies 60 arranged in an array and a magnetic back 40. The coil assemblies 60 are fixed to the magnetic back 40.

In FIG. 2, the solid line arrows in the magnet array 55 represent the polarity of the individual magnets of the magnet array 55. Each coil assembly 60 defines a core chamber 61. The core chamber 61 is the region defined by the coil assembly 60. The core chamber 61 is inside the coil assembly 60 such that it appears that the coil assembly 60 is wound around the core chamber 61. The core chamber height 61d matches the height of the coil assembly 60. The width of the core chamber 61 corresponds to the inner diameter of the coil assembly 61. In FIG. 2, the dashed arrows that form circuits represent the magnetic flux.

To make a Lorentz moving magnet system that can provide an increased acceleration, the amount of moving actuator mass is increased as a by-product. At higher levels of acceleration, the amount of moving actuator mass can become a problem and the size of the cable slab (e.g. because of thicker conductors) can be a problem. The cable slab corresponds to the electrical cables that connect the coil assemblies 60 to a power source. The power source provides electrical power to the coil assemblies. An electrical current flows through the coil assemblies 60.

Figure 3:
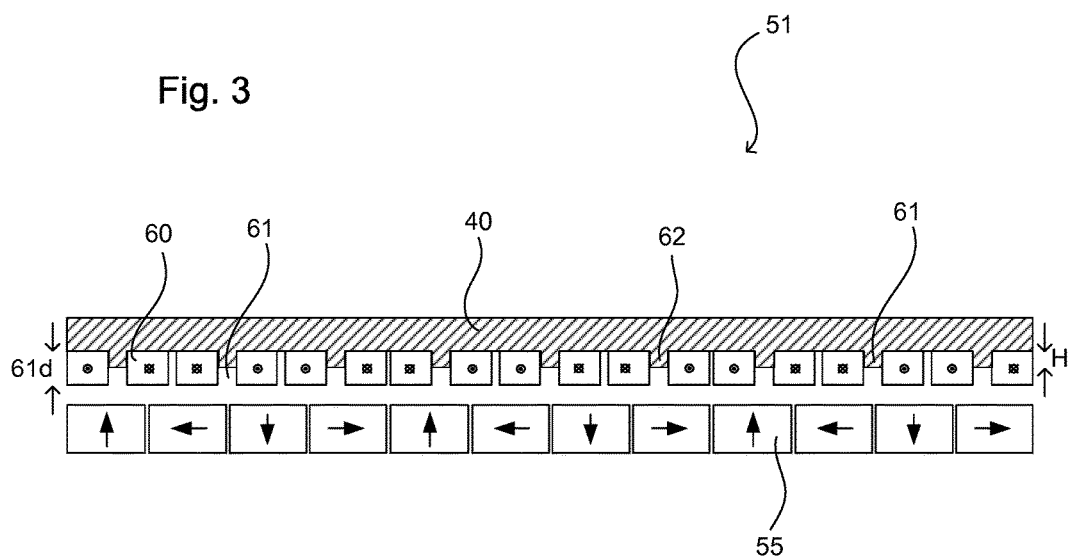

FIG. 3 depicts an embodiment of an actuator 51 according to an embodiment of the present invention. As depicted in FIG. 3, in an embodiment the actuator 51 comprises coil assemblies 60 arranged in an array. Each coil assembly 60 defines a core chamber 61 (sometimes called the coil eye) having a core chamber height 61d.

In an embodiment the actuator 51 comprises at least one magnetic member 62. The magnetic member 62 extends partly along the core chamber height 61d of the core chamber 61 of a corresponding at least one coil assembly 60. The magnetic member 62 is made of a magnetic material. The magnetic member 62 is inside the core chamber 61. The core chamber 61 has a core chamber height 61d that corresponds to the height of the coil assembly 60. The magnetic member 62 partly fills the core chamber 61. An empty part of the core chamber 61 has a height less than the height of the core assembly 60. However, the core chamber 61 as a whole (i.e. the empty part and the part filled by the magnetic member 62) has a core chamber height 61d that corresponds to the height of the coil assembly 60.

By providing the magnetic member 62, the efficiency of the actuator 51 is increased. An embodiment of the invention is expected to achieve an increased force density compared to the Lorentz moving magnet prior art actuator 52 depicted in FIG. 2. The force density of the actuator 51 is defined as the force produced by the actuator 51 divided by the mass of the actuator 51. By increasing the force density of the actuator 51, an actuator 51 of a given mass can achieve higher levels of acceleration. An embodiment of the invention is expected to achieve higher levels of acceleration by an actuator 51 of a given mass.

In an embodiment at least one of the magnetic material of the magnetic member 62, a shape of the magnetic member 62, a size of the magnetic member 62 and a position of the magnetic member 62 is selected so as to select one or more parameters of the actuator 51. For example, the height H (as shown in FIG. 3) of the magnetic member 62 can be chosen independently from the core chamber height 61d. The height H of the magnetic member 62 corresponds to the dimension of the magnetic member 62 in the direction perpendicular to the plane of the magnetic back 40.

The height H of the magnetic member 62 can be selected to take any value greater than 0 and less than the core chamber height 61d. The height H of the magnetic member 62 can be selected so as to select one or more parameters of the actuator 51. The greater the height H of the magnetic member 62, the greater the force density of the actuator 51. However, the greater the height H of the magnetic member 62, the greater the parasitic forces of the actuator 51. By providing that the height H of the magnetic member 62 can be chosen independently from the core chamber height 61d of the core chamber 61, the structure of the actuator 51 can be chosen so as to make a choice between parasitic forces and the force density of the actuator 51. The structure of the actuator 51 can make a desirable compromise between parasitic forces and force density of the actuator 51. An embodiment of the invention is expected to achieve an improvement in the efficiency of the actuator 51 without suffering from parasitic forces that are too high. This can be achieved by adding the magnetic member 62 in the core chamber 61 of the coil assemblies 60.

As depicted in FIGS. 3 to 8, in an embodiment each coil assembly 60 has a magnetic member 62 in its core chamber 61. However, this is not necessarily the case. In an embodiment, some of the coil assemblies 60 may be provided with the magnetic member 62 and others of the coil assemblies 60 may not be provided with the magnetic member 62.

Figure 9:
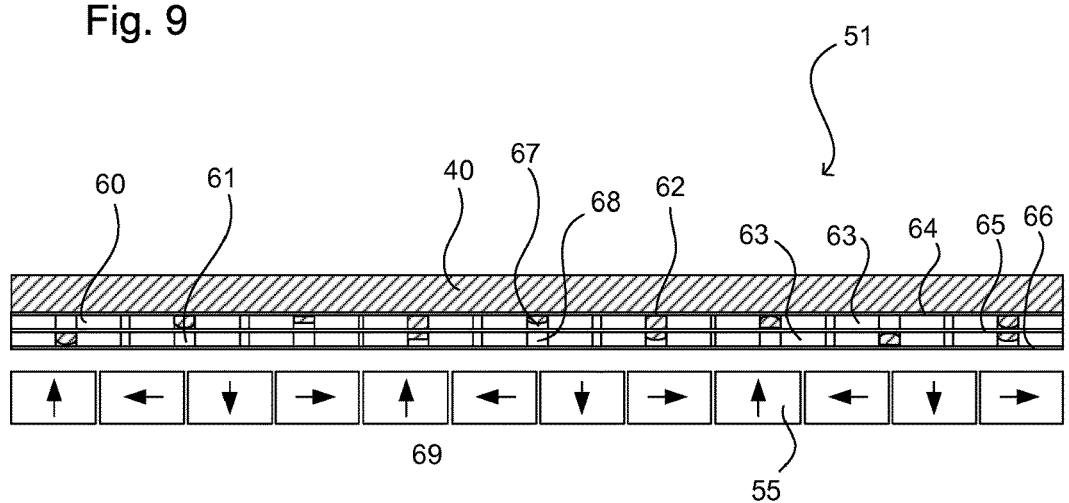

In an embodiment all of the magnetic members 62 of the actuator 51 are substantially identical. However, this is not necessarily the case. For example, as shown schematically in FIG. 9, the magnetic material of the magnetic members 62, their size, their position and their shape may vary across the coil assemblies 60.

FIG. 4 depicts an embodiment of an actuator 51 according to the present invention. Some of the components of the actuator 51 depicted in FIG. 3 are the same as some of the components depicted in FIG. 3. This is indicated by using the same reference numerals in FIG. 3 and FIG. 4.

In FIG. 4, the solid arrows shown in the magnet array 55 represent the direction of polarity of the individual magnets of the magnet array 55. The arrangement of the directions of polarity is merely exemplary. In FIG. 4, the magnet array 55 is configured as a Halbach array. However, other configurations are possible. For example, in an embodiment the magnet array is configured as a sinusoidal array. In an embodiment, the direction of polarity of the magnets rotates by 45° from one magnet to the next. In an embodiment the magnet array 55 comprises individual magnets having a periodic arrangement.

As depicted in FIG. 4, in an embodiment each coil assembly 60 comprises at least two sub-coils 63 which are stacked. A coil assembly 60 that comprises at least two stacked coils 63 may be called a stacked coil assembly. The sub-coil 63 that is closest to the magnetic back 40 defines a back core compartment 67. The sub-coil 63 that is furthest from the magnetic back 40 defines a front core compartment 68.

In an embodiment each coil assembly 60 comprises an intermediate plate 65. The intermediate plate 65 is positioned between the at least two sub-coils 63. If the coil assembly 60 comprises more than two sub-coils 63, then the coil assembly 60 may comprise more than one intermediate plate 65. For example, if the coil assembly 60 comprises four sub-coils 63, then the coil assembly 60 may comprise three intermediate plates 65 between the four sub-coils 63.

As depicted in FIG. 4, in an embodiment the core chamber 61 of the coil assembly 60 comprises a back core compartment 67 and a front core compartment 68. The back core compartment 67 is positioned between the front core compartment 68 and the magnetic back 40. The distance between the back core compartment 67 and the magnetic back 40 is less than the difference between the front core compartment 68 and the magnetic back 40.

As depicted in FIG. 4, in an embodiment the actuator 51 comprises an isolation plate 64. As depicted in FIG. 4, in an embodiment the magnetic member 62 extends through the isolation plate 64. The isolation plate 64 may comprise a series of holes for allowing each magnetic member 62 to extend through the isolation plate 64.

As depicted in FIG. 4, in an embodiment the actuator 51 comprises a closing plate 66. The closing plate 66 is provided at an end of the coil assemblies 60. In an embodiment the closing plate 66 provides a surface that faces the magnet array 55. The coil assemblies 60 are between the closing plate 66 and the magnetic back 40.

In an embodiment one or more of the isolation plates 64, the intermediate plate 65 and the closing plate 66 is a cooling plate configured to reduce the temperature of the coil assemblies 60. In an embodiment the cooling plates contain a cooling medium configured to remove the heat away from the coil assemblies 60. For example, the cooling medium may be a liquid such as water or may be a gas such as air or an evaporative medium.

FIG. 5 depicts an embodiment of an actuator 51 according to the present invention. As depicted in FIG. 5, in an embodiment the actuator 51 comprises a magnetic back 40. In an embodiment the coil assemblies 60 are fixed to the magnetic back 40. In an embodiment the magnetic member 62 is spaced from the magnetic back 40. By providing that the magnetic member 62 is spaced from the magnetic back 40, the magnetic member 62 is not directly connected with the magnetic back 40.

The shape, size and position of the magnetic member 62 can be selected independently of the magnetic back 40 so as to tune one or more parameters of the actuator 51. The magnetic material of the magnetic member 62, as well as its dimensions and shape can be selected such that the actuator 51 is optimised for a specific function or use.

As depicted in FIG. 5, in an embodiment the isolation plate 64 is between the magnetic back 40 and the magnetic member 62. The isolation plate 64 separates the magnetic back 40 from the magnetic member 62. The magnetic member 62 does not come into contact with the magnetic back 40. The magnetic member 62 can be manufactured as a separate component from the magnetic back 40 before the magnetic member 62 and the magnetic back 40 are combined in the actuator 51. An embodiment of the invention is expected to make it easier to manufacture an actuator 51 that has magnetic material in the core chamber 61.

In an embodiment a method of manufacturing the actuator 51 comprises grinding the magnetic material to form the magnetic member 62 such that at least one of the shape of the at least one magnetic member and the size of at least one magnetic member is selected so as to select one or more parameters of the actuator.

In an embodiment, the isolation plate 64 is configured to electrically isolate the coil assemblies 60 from the magnetic back 40. In use of the actuator, a current passes through the coil assemblies 60. In use, there is a potential difference between the magnetic back 40 and the coil assemblies 60. In an embodiment the magnetic back 40 may be grounded. In use of the lithographic apparatus 100, the potential difference between the magnetic back 40 and the coil assemblies 60 may be in the region of about 800V. In order to improve reliability and safety of the actuator 51, it is desirable for the actuator 51 to be able to operate with a potential difference in the region of about 2,500V between the magnetic back 40 and the coil assemblies 60.

It can be difficult to provide electrical isolation between the coil assemblies 60 and the magnetic back 40 (e.g. see FIG. 3). By providing that the isolation plate 64 is configured to electrically isolate the coil assemblies 60 from the magnetic back 40, it is easier to manufacture the actuator 51. It is not necessary to provide alternative means for providing electrical isolation between the magnetic back 40 and the coil assemblies 60, which could otherwise be expensive. The FIG. 5 embodiment of the invention is expected to reduce the cost of manufacturing an actuator 51 that has magnetic material inside the core chamber 61 of the coil assemblies 60.

As depicted in FIG. 5, in an embodiment the isolation plate 64 is substantially continuous. This means that the isolation plate 64 does not include holes for each magnetic member 62 to extend through. In contrast, the actuator 51 depicted in FIG. 4 includes holes in the isolation plate 64. In the actuator 51 depicted in FIG. 4, each magnetic member 62 is like a tooth extending from the magnetic back 40 through the isolation plate 64.

In the actuator 51 depicted in FIG. 5, the magnetic member 62 is provided separately from the magnetic back 40. Each magnetic member 62 is integrated inside the coil assemblies 60. This makes it easier to manufacture the actuator 51. It is easier to provide electrical isolation between the coil assemblies 60 and the magnetic back 40. It is easier to cast the coil assemblies 60 with the isolation plate 64, the intermediate plate 65 and the closing plate 66. It is possible to manufacture, e.g. glue, the magnetic back 40 separately from the coil assemblies 60. This makes it easier to manufacture the actuator 51. It is not necessary to assemble the magnetic back 40 simultaneously with the coil assemblies 60.

In an embodiment the magnetic back 40 is smaller than the horizontal extent of the coil assemblies 60 arranged in an array. In an embodiment at least one magnetic member 62 is beyond the magnetic back 40. This would not be possible if the magnetic member 62 were integral with the magnetic back 40. By providing that the magnetic member 62 is independent of the magnetic back 40, the magnetic member 62 can be provided for coil assemblies 62 that extend beyond the magnetic back 40. Accordingly, the size and mass of the actuator 51 can be reduced by reducing the size of the magnetic back 40 relative to the array of coil assembly 60. Reducing the mass of the actuator 51 can have a positive effect on the force density of the actuator 51.

It is not necessary for the magnetic member 62 to be separate from the magnetic back 40. For example, as depicted in FIG. 3 and FIG. 4, in an embodiment the magnetic member 62 is part of the magnetic back 40.

In an embodiment the isolation plate 64 and the closing plate 66 are at opposite ends of the coil assembly 60 so as to contain the magnetic member 62 within the core chamber 61. The magnetic member 62 may be totally encapsulated by the isolation plate 64 and the closing plate 66. This may make it easier to control, or prevent, partial discharge from the coil assemblies 60 towards the magnetic members 62.

Figure 10:
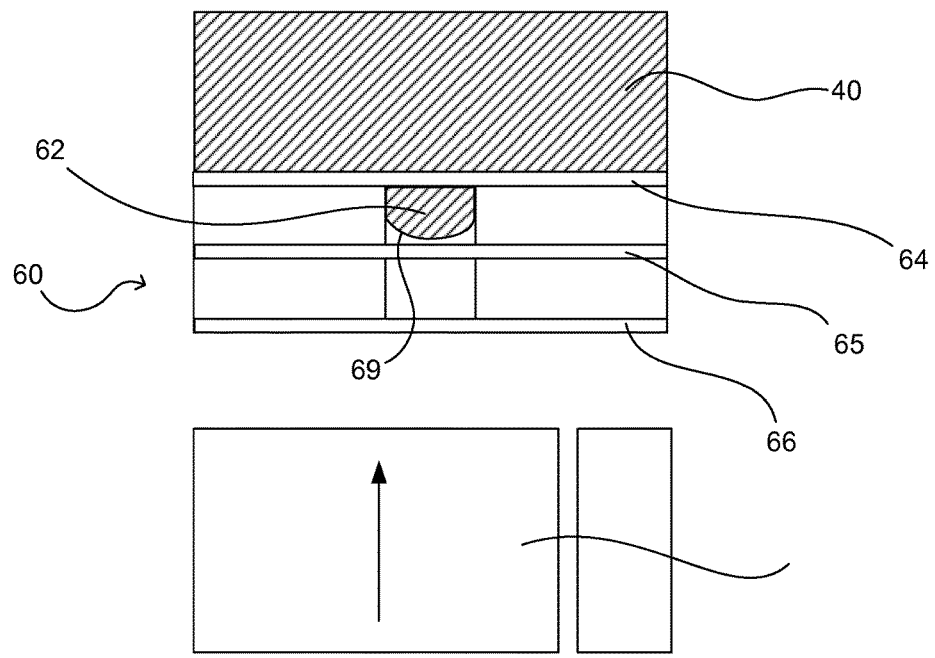
FIG. 10 depicts an enlarged version of part of the actuator depicted in FIG. 6.

FIG. 6 depicts an embodiment of an actuator 51 according to the present invention. As depicted in FIG. 6, in an embodiment the shape of the magnetic member 62 is selected such that the magnetic member 62 has a rounded surface 69. FIG. 10 depicts a zoomed-in version of part of the actuator 51 depicted in FIG. 8. The rounded surface 69 of the magnetic member 62 can be seen in FIG. 10. In an embodiment the rounded surface 69 of the magnetic member 62 faces away from the magnetic back 40. In use of the lithographic apparatus 100, the rounded surface 69 of the magnetic member 62 faces the magnet array 55. The shape of the magnetic member 62 is selected so as to optimize one or more parameters of the actuator 51. For example, by providing that the magnetic member 62 has a rounded surface 69 facing away from the magnetic back 40, parasitic forces produced by the actuator 51 may be reduced, without significantly reducing the force density of the actuator 51.

Figure 7:
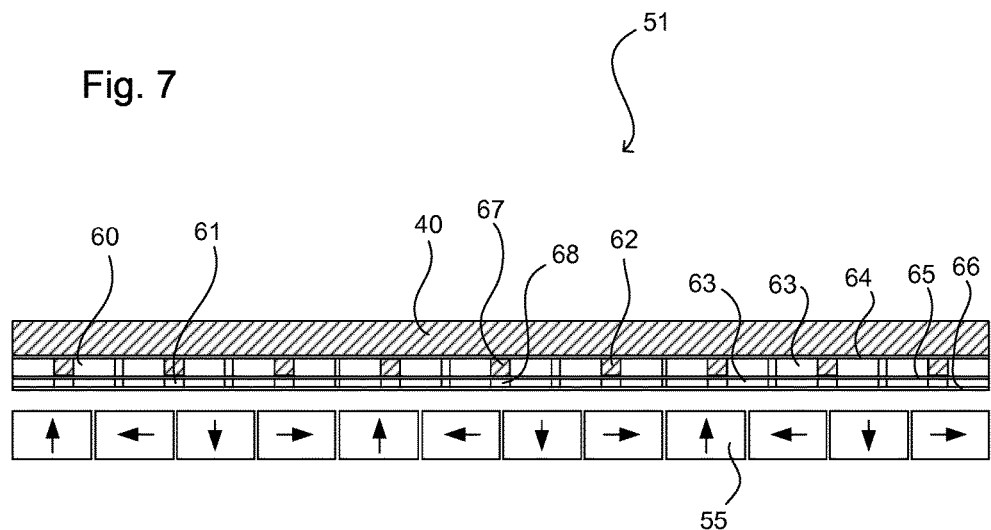

FIG. 7 depicts an embodiment of an actuator 51 according to the present invention. As depicted in FIG. 7, in an embodiment the back core compartment 67 is larger than the front core compartment 68. However, this is not necessarily the case. In an embodiment the back core compartment 67 is smaller than the front core compartment 68.

In an embodiment it is the core compartment that contains the magnetic member 62 (e.g. the back core compartment 67 in FIG. 7) that is larger than the other core compartment that does not contain a magnetic member (e.g. the front core compartment 68 in FIG. 7).

By providing that the back core compartment 67 containing the magnetic member 62 is larger than the front core compartment 68 not containing any magnetic member, the magnetic member 62 extends along over half of the core chamber height 61$d$ of the core chamber 61. The more of the core chamber 61$d$ that the magnetic member 62 extends along, the greater the force density of the actuator 51.

As depicted in FIG. 5 and FIG. 6, in an embodiment the back core compartment 67 contains the magnetic member 62 and the front core compartment does not contain any magnetic member. Part of the core chamber 61 is filled with magnetic material and part of the core chamber 61 is not filled with magnetic material. It is not necessary for the magnetic member 62 to be in the back core compartment 67.

FIG. 7 depicts an embodiment of an actuator 51 according to the present invention. As depicted in FIG. 7 in an embodiment the front core compartment 68 contains the magnetic member 62 and the back core compartment 67 does not contain any magnetic member.

Figure 8:
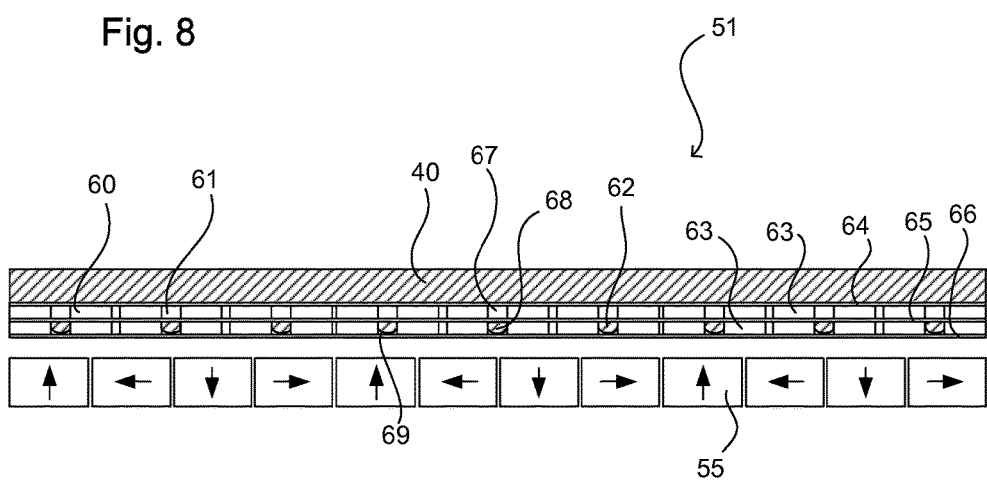

Features of the arrangements depicted in FIGS. 3 to 8 can be combined with each other. For example, in an embodiment the magnetic member 62 has a rounded surface 69 (as shown in FIGS. 6 and 8) and the magnetic member 62 is part of the magnetic back 40 (as shown in FIGS. 3 and 4).

In an embodiment the magnetic material of the magnetic member 62 is a soft magnetic material. A soft magnetic material is a material that has a relative permeability greater than ten. In an embodiment the soft magnetic material is selected from a group consisting of a cobalt-iron magnetic alloy, a nickel-iron magnetic alloy, pure iron, a low-carbon steel and an electrical steel. The term "pure iron" is used to mean a magnet iron, i.e. a relatively pure iron. Other suitable soft magnetic materials may also be used. The magnetic material of the magnetic member 62 may be selected depending on the specific function or use of the actuator 51.

In an embodiment the magnetic material of the magnetic member 62 is different from the material from which the magnetic back 40 is made. The magnetic back 40 may be made from a ferrite material such as iron, for example. The magnetic member 62 may be made of a soft magnetic material.

It is not necessary for the isolation plate 64, the intermediate plate 65 and the closing plate 66 to be cooling plates. In an embodiment the actuator 51 comprises an alternative cooling system. For example, in an embodiment an aluminium structure is provided within the magnetic back 40 or attached to the magnetic back 40. The aluminium structure may comprise a plurality of cooling channels containing a cooling medium for removing heat away from the actuator 51.

In an embodiment the coil assemblies 60 may extend across a length in the region of about 1.5 m. Hence, it is important that it is efficient and easy to manufacture the actuator 51. By providing that the magnetic member 62 is separate from the magnetic back 40, the surfaces of the magnetic back 40 can be made to be substantially flat. When the magnetic members 62 are formed as part of the magnetic back 40, it can be difficult to line up the magnetic members 62 with the coil assemblies 60 so that each coil assembly 60 is provided with a protruding magnetic member 62 in its core chamber 61. When combining a magnetic back 40 having protruding magnetic members 62 with the coil assemblies 60, it is possible to trap gas bubbles between the magnetic back 40 and the coil assemblies 60, for example when the coil assemblies 60 are potted. Such gas bubbles are undesirable. By providing the magnetic members 62 as separate items from the magnetic back 40, the possibility of bubbles being formed during manufacture of the actuator 51 is reduced.

By providing the magnetic members 62 separately from the magnetic back 40 and providing the isolation plate 64, the interface between the magnetic back 40 and the isolation plate 64 is simple. This allows for less tight tolerances during manufacture of the actuator 51.

In an embodiment the height of the magnetic member 62 can be chosen independently of the height available (i.e. the core chamber height 61d) in the core chamber 61 (i.e. coil eye). The magnetic member 62, which may be called a ferrite part, can be used during manufacture as a selection criterion to tune the design of the actuator 51 for specific force density and parasitic forces. The shape of the cross-section of the magnetic member 62 can also be tuned to result in low parasitic forces while still contributing to the improved force density relative to the Lorentz moving magnet prior art actuator 52 depicted in FIG. 2.

It is not necessary that one of the core compartments does not contain any magnetic member. In an embodiment both the back core compartment 67 and the front core compartment 68 contains a magnetic member 62. Each coil assembly 60 may be provided with a plurality of magnetic members 62.

In an embodiment the core chamber height 61d may be in the region of from about 10 mm to about 250 mm. In an embodiment the magnetic member 62 may have a height in the region of from about 1 mm to about 10 mm. In an embodiment one or more of the isolation plate 64, the intermediate plate 65 and the closing plate 66 may have a thickness in the region of from about 1 mm to about 2 mm. In an embodiment the magnet array 55 has a magnetic period of about 75 mm. The magnetic period corresponds to the distance between the centers of individual magnets having the same direction of polarity within the magnetic array 55. In an embodiment the width of the core chamber 61 is in the region of from about 5 mm to about 20 mm, for example about 10 mm.

In an embodiment the parameters of the actuator 51 that are selected by the material, shape, size and position of the magnetic member 62 include one or more of a force density, a steepness, a normal force, an inductance, and a K-factor ripple. The normal force and the K-factor ripple are parasitic forces of the actuator 51. The normal force is an attractive force between the magnetic back 40 and the magnetic array 55. Steepness is a general actuator/motor "efficiency" parameter and is commonly used in literature in this technical field. The steepness is defined by the square of the force produced by the actuator 51 divided by the power dissipated within the coil assemblies 60. A high steepness value indicates that the actuator 51 produces a high force and low dissipation.

In use, the magnetic array 55 may move horizontally with respect to the coil assemblies 60. During this relative movement, the attraction force between the magnetic back 40 and the magnetic array 55 can change, for example because of the changes in directions of polarity of the magnets of the magnetic array 55. This attraction force can reduce the accuracy of the positioning device comprising the actuator 51. This phenomenon may be called cogging. An embodiment of the invention is expected to achieve a reduction in cogging relative to known actuators of the same force density.

In the Lorentz moving magnet prior art actuator 52 shown in FIG. 2, there is no magnetic member in the core chamber 61 of the coil assembly 60. When current is provided through the coil assemblies 60 and the magnetic array 55 moves horizontally with respect to the coil assemblies 60, there are small parasitic forces acting between the magnetic array 55 and the coil assemblies 60. However, when the magnetic member 62 is provided such parasitic forces can be larger. When providing the magnetic member 62, there is a balance between increasing the force density and increasing parasitic forces.

Simulations have been performed to measure the effects of providing the magnetic member 62 in the present invention. The simulation results show that by adding the magnetic member 62 in the core chamber 61, the force density of the actuator 51 is increased and the power dissipation is decreased. The power dissipation is the amount of power that is dissipated in the coil assemblies 60 when the actuator 51 produces a certain force. The power is dissipated in the coil assemblies 60 and heats up of the coil assemblies 60. The measure of power dissipation may be called the thermal performance of the actuator 51. The simulation results show that the power dissipation may be reduced by, for example, 35%.

The thermal performance of the actuator 51 may be the limiting factor for the force density of the actuator 51. The thermal performance of the actuator 51 is related to the power dissipation within the coil assembly 60. By reducing the power dissipation, the force density of the actuator 51 is increased. The simulation results show that the force density may be increased by about 20%, for example, by providing the magnetic member 62.

The volume of the core chamber 61 that is not filled with the magnetic member 61 provides an air gap in the magnetic circuit. In the present invention, such an air gap exists because part of the core chamber 61 is not filled with any magnetic material. By providing the air gap, the normal forces are lower compared to if the whole of the core chamber 61 were filled with the magnetic member 62. The simulation results show that an embodiment of the invention is expected to achieve a similar normal force to the Lorentz moving magnet prior art actuator 52 depicted in FIG. 2. This is because of the improved force density of the present invention. The improved force density means that the volume of the actuator 51 (and the magnetic array 55) can be reduced while still providing the same level of force by the actuator 51. By reducing the total volume of the actuator 51, the overall normal force is reduced.

An embodiment of the invention is expected to achieve an increase in the ratio of force density to parasitic forces. This ratio is controllable with the material, shape, size and position of the magnetic member 62. The material, shape, size and position of the magnetic member 62 can be selected so as to suit the application of the actuator 51.

Table 1 below shows the impact of increasing the height H of the magnetic member 62. The height H of the magnetic member 62 is how far along the core chamber height 61d the magnetic member 62 extends. The results in Table 1 are based on a simulation in which the core chamber height 61d is about 16 mm.

TABLE 1

| Height H | Steepness | Normal force | Inductance | Force density |
|---|---|---|---|---|
| 0 | 1.00 | 1.00 | 1.00 | 1.00 |
| 3 | 1.14 | 1.11 | 1.08 | 1.07 |
| 5 | 1.32 | 1.21 | 1.19 | 1.15 |
| 7 | 1.58 | 1.35 | 1.32 | 1.26 |
| 9 | 1.95 | 1.51 | 1.48 | 1.40 |

The first row in Table 1 shows the normalised value of a prior art actuator 52 which has no magnetic member 62 (e.g. as shown in FIG. 2). Hence the values shown in the table are dimensionless. All of the other rows in Table 1 are compared with that normalised value.

The steepness is defined by the square of the force produced by the actuator 51 divided by the power dissipated within the coil assemblies 60. It is desirable for the steepness to be as high as possible. Table 1 shows that the steepness desirably improves significantly with increased height H of the magnetic member 62. The power dissipation reduces by the same ratio that the steepness improves.

By providing the magnetic member 62 inside the core chamber 61, the normal force is increased (relative to the prior art actuator 52 depicted in FIG. 2), but remains about a factor of four lower than an actuator in which the whole of the core chamber 61 is filled with magnetic material of the magnetic back 40.

The force density desirably increases with increased height H of the magnetic member 62. This enables a lighter, more compact actuator design.

The parasitic forces produced by the actuator 51 of the present invention increase with increased height H of the magnetic member 62. However, the parasitic forces remain substantially lower than the parasitic forces of an actuator of a similar size in which the whole of the core chamber 61 is filled with magnetic material of the magnetic back 40.

The simulation results show that cogging may be reduced by a factor of about 15 relative to an actuator in which the whole of the core chamber 61 is filled with magnetic material of the magnetic back 40.

K-factor ripple is a parasitic force that varies the force produced by the actuator 51 relative to the force that the actuator 51 is intended to produce. The K-factor ripple corresponds to variation in the intended force. The K-factor ripple is at least partly periodic. The periodic content of the K-factor ripple of the present invention is more sinusoidal compared to that of an actuator in which the whole of the core chamber 61 is filled with magnetic material of the magnetic back 40. An embodiment of the invention is expected to make it easier to compensate for the K-factor ripple using software controlled algorithms, for example.

K-factor ripple relates to the variation of the K-factor. The K-factor is defined by the ratio of the force produced by the actuator 51 to the current that flows through the coil assemblies 60. K-factor=Force/Current. The force of the actuator 51 is not constant with respect to the relative positions of the coil assemblies 60 and the magnet array 55. The magnets of the magnet array 55 have an associated magnetic field density having an amplitude. The coil assemblies 60 have an associated current density having an amplitude. The amplitude of the magnetic field density and the amplitude of the current density varies depending on the relative positioning of the magnet array 55 and the coil assemblies 60. The force produced by the actuator 51 depends on the amplitude of the magnetic field density and the amplitude of the current density. Hence, the force produced by the actuator 51 varies depending on the relative positioning of the magnet array 55 and the coil assemblies 60.

The present invention can be applied to a long stroke LoS positioning system, e.g. a positioning system with a range of more than 100 mm in at least one direction. The present invention can be applied to a short stroke SS positioning system, e.g. a positioning system with a range of less than 10 mm in at least one, and desirably all, directions.

In order to shorten the exposure wavelength and, thus, reduce the minimum printable size, it has been proposed to use an extreme ultraviolet (EUV) source of radiation. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

Figure 11:
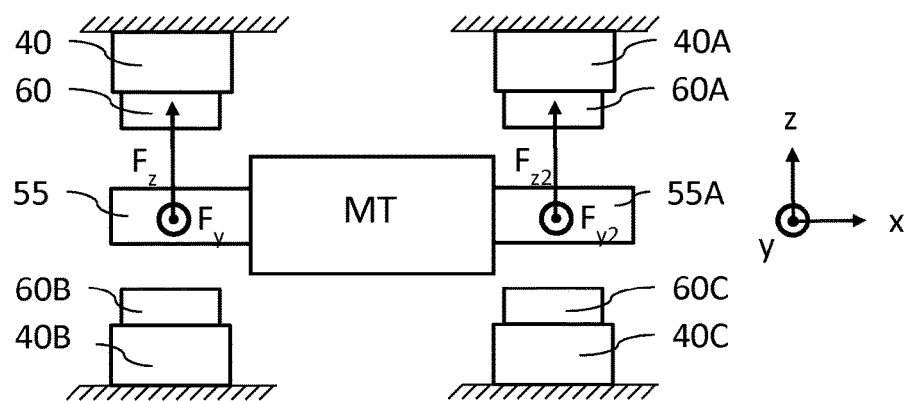
FIG. 11 depicts an embodiment of a stage system having an actuator.

FIG. 11 shows a stage system according to an embodiment of the invention. The stage system has a movable body, the magnet array 55, the coil assembly 60 and the magnetic back 40. The movable body may be the mask support structure MT or the wafer table WT. The magnet array 55 is connected to the movable body. The coil assembly 60 is elongated in the y-direction and is arranged to cooperate with the magnet array 55 to drive the movable body in the y-direction. Elongated in the y-direction means that multiple coils are arranged next to each other along the y-direction. The coil assembly 60 and the magnet array 55 form the actuator 51 according to any of the previously mentioned embodiments. Alternatively, the coil assembly 60 and the magnet array 55 form the prior art actuator 52 as shown in FIG. 2. The controller 500 is arranged to commutate the coil assembly 60 so as to create a driving force Fy for moving the movable body along the y-direction and so as to create a supporting force Fz for at least partly supporting the movable body.

The driving force Fy and the supporting force Fz are in different directions. The driving force Fy may be in a horizontal plane, for example in a direction perpendicular to the optical axis of the projection system PS. The supporting force Fz may be vertical. The driving force Fy and the supporting force Fz may be perpendicular to each other. Supporting force Fz may be perpendicular to the surface of the magnet array 55 that faces the coil assembly 60.

The controller 500 may provide an electrical current to each of the coils in the coil assembly 60. In order to create the driving force Fy to move the magnet array 55 relative to the coils, the controller 500 needs to commutate the coils.

The commutation is done by providing an electrical current to each of the coils with a certain current amplitude and a certain current phase. The current phase depends on the position of the magnet array 55 relative to the coil assembly 60. For example, the dependence between the current phase and the position of the magnet array 55 relative to the coil assembly 60 may be sine-shaped. In this example, the three coils are commutated by applying an electrical current to each of the coils, wherein the profile of the electrical current is sine-shaped. The amplitude of the sine-shape is the same for each of the three coils, but the phase of the sine-shape is 0° for the first coil, 120° for the second coil and 240° for the third coil.

An example of commutation is given in the equation Eq(1) as stated in the Annex to the Description. The equation Eq(1) has the following parameters: Ipeak=maximum electrical current through a coil in the coil assembly 60, p=position of the magnet array 55 relative to the coil assembly 60, τ=the magnet pitch, i.e., the length of a north and a nearest south in the magnet array 55, φ=commutation angle, i=the phase of the coil. In this example, there is a three phase commutation. So to determine the electrical current "I" for each of the three phases, equation Eq(1) needs to be used three times; once with i=1 for the first phase, once with i=2 for the second phase and once with i=3 for the third phase. Each phase may be implemented by a single coil or by multiple coils in the coil assembly 60.

In known actuators, the commutation angle φ is set to maximize the driving force Fy to achieve a maximum efficiency. However, the inventors discovered that when deviating from the commutation angle φ that maximizes the driving force Fy, the commutation angle φ can be used to create the supporting force Fz to support the movable body.

Figure 12:
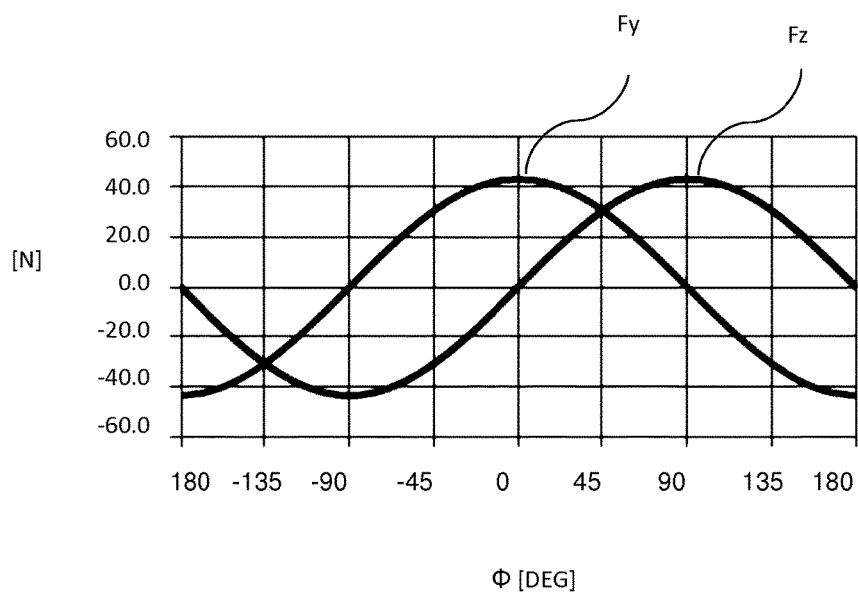
FIG. 12 depicts a driving force and a supporting force as a function of the commutation angle.

In FIG. 12, an example of the relationship of the driving force Fy and the supporting force Fz with respect to the commutation angle φ is given. For a commutation angle φ of 0°, the driving force Fy is at a maximum and the supporting force Fz is zero. By changing the commutation angle φ, the supporting force Fz can be increased at the expense of the driving force Fy. In an extreme event, when the commutation angle φ is 90°, the supporting force Fz is at a maximum and the driving force Fy is zero.

When the movable body needs to move with a high acceleration, for example 5 g or 10 g or 40 g or 80 g or more (wherein g corresponds with the standard gravity value, being about 9.81 m/s$^2$), the driving force Fy is substantially higher than the supporting force Fz. The supporting force Fz would typically be no larger than when the movable body accelerates at 1 g, since the supporting force Fz would need to counter gravity.

Since the relationship between the driving force Fy and the supporting force Fz as a function of the commutation angle φ is sine-shaped, it can be seen from FIG. 12 that for a small supporting force Fz, a small commutation angle is need. For example a commutation angle of 1°-5°. For such small commutation angles, the driving force Fy is not substantially affected. For example, the driving force Fy is reduced with less than 1%.

So without substantially affecting the driving force Fy, the weight of the movable body and the weight of the magnet array 55, may be supported by the supporting force Fz. Supporting the movable body with the supporting force Fz has the benefit that a bearing for supporting the movable body may be omitted. Omitting such a bearing reduces the weight of the movable body, so the actuator 51 requires less power to accelerate the movable body. Omitting such a bearing is especially beneficial when the movable body is applied in a vacuum environment. In a vacuum environment, the bearing would need a seal to separate the bearing from the vacuum environment. The seal would prevent particles or a gas flow from the bearing to enter the vacuum environment.

A seal would further have a certain stiffness between the movable body and the coil assembly 60. By measuring the vertical position of the movable body and by controlling the commutation angle φ so as to create a desired supporting force Fz, a desired stiffness can be created electronically between the movable body and the coil assembly 60. Such an electronically created stiffness can be beneficial to avoid external forces from disturbing the position control of the magnet array 55.

The movable body may be provided with a further magnet array 55A. The further magnet array 55A may be similar to the magnet array 55. The further magnet array 55A is arranged at a distance from the magnet array 55. In FIG. 11, there is an offset in the x-direction between the magnet array 55 and the further magnet array 55A. A further coil assembly 60A is arranged to cooperate with the further magnet array 55A. The further coil assembly 60A may be similar to the coil assembly 60. The further coil assembly 60A may be connected to magnetic back 40a. The further coil assembly 60A and the further magnet array 55A are arranged to create a further driving force Fy2 and a further supporting force Fz2.

When using the drive force Fy and the further driving force Fy2, the movable body can be rotated along the z-direction. When using the supporting force Fz and the further supporting force Fz2, the movable body can be rotated along the y-direction.

In an embodiment, the coil assembly 60 is extended in the y-direction. The coil assembly 60 has a plurality of coils arranged next to each other along the y-direction. The plurality of coils are commutated in at least two groups. Each of the groups is able to generate a supporting force Fz independently of the other group. Since there is an offset in the y-direction between the supporting forces Fz that each group can generate, the movable body can be rotated along the x-direction. Each group may be connected to a separate amplifier, for example a 3-phase amplifier. Each coil within a group may be connected to a separate amplifier. Coils from different groups that require the same current phase may be connected to the same amplifier.

Figure 16:
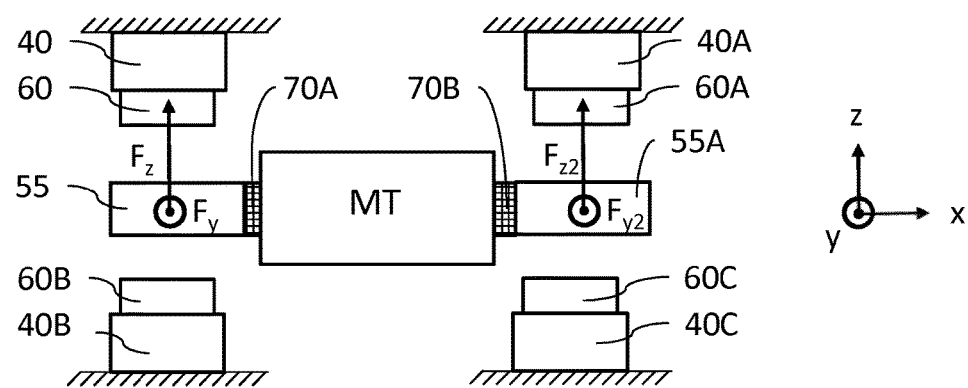
FIG. 16 depicts an embodiment of a stage system having an actuator.

In an embodiment, the supporting force Fz can be determined from a measured force by using e.g. a force sensor. Such a measured force can be obtained by using a configuration as shown in FIG. 16, wherein two force sensors 70A and 70B are placed between the mask support structure MT and the magnet arrays 55 and 55A. Such an embodiment may be beneficial as due to small tolerances in, for example, motor component characteristics and motor part positioning a small percentage of the driving force Fy may be exerted in other directions, like the z-direction. Such an undesired force is indicated as a "parasitic force". For a description of the other features shown in FIG. 16 see, e.g. FIG. 11. The force measured by the force sensor can be used in an extra control loop in a feedback configuration to compensate for the parasitic force. In an embodiment the force measured by the force sensor is measured on-line and fed back to the motor by a force controller. Note that although two force sensors 70A, 70B are shown in FIG. 16, it is beneficial to include at least one force sensor and accordingly the invention is not limited to an embodiment having two force sensors. In an alternative embodiment the measured force is fed back to the commutation algorithm by a force controller.

If no force is intended in a certain direction and a force in that direction is measured, then that measured force is considered as a parasitic force. If a certain force is intended then the difference between the intended force and the measured force is considered as considered as a parasitic force. Alternatively it is possible to measure the induced forces in a number of experiments, whereby the resulting forces are determined off-line. As an example, the mask support structure MT may be moved using different accelerations and at different positions during a number of experiments. The resulting forces are stored as a function of the position and the acceleration in, for example, a look-up table. In use, the stored forces can be supplied to the motor input and hence compensate for the undesired parasitic force. In a further alternative embodiment it is possible to measure the actual gap between the coil assembly and the magnet array or for example the actual gap of the air bearing that supports the mask support structure MT can be measured. As the air bearing represents a certain stiffness the resulting force due to a change of the dimensions of the gap can be determined. Alternatively the force can be deducted from pressure and flow measurements in the air bearing.

When combining the arrangements described above, the movable body can be controlled by the controller 500 in at least 5 degrees of freedom, i.e., translations in y and z, and rotations along x, y and z. An additional actuator can be added to drive the movable body in the x-direction to control the movable body in all 6 Degrees of Freedom.

As shown in FIG. 11, the actuator 51 may comprise another coil assembly, i.e., coil assembly 60B. Coil assembly 60B may be connected to magnetic back 40B. Coil assembly 60B cooperates with the magnet array 55 to contribute to the driving force Fy and the supporting force Fz. The magnet array 55 is between the coil assembly 60 and the coil assembly 60B. By adding the coil assembly 60B, the electrical current through the coil assembly 60 can be reduced for a desired driving force Fy and a desired supporting force Fz. Alternatively, the coil assembly 60 and the coil assembly 60B can be used together to create a larger driving force Fy or a larger supporting force Fz.

Adding the coil assembly 60B may have another benefit. If the movable body moves in the z-direction away from the coil assembly 60, the gap between the coil assembly 60 and the magnet array 55 becomes larger. The increase of the gap reduces the efficiency with which the driving force Fy can be generated with the coil assembly 60. However, at the same time, the gap between the magnet array 55 and the coil assembly 60B becomes smaller. A smaller gap increases the efficiency with which the driving force Fy can be generated with the coil assembly 60B. So by adding the coil assembly 60B, the negative effect of a movement of the movable body in the z-direction can be reduced. In a similar way, an additional coil assembly 60C may be arranged so that magnet array 55A is between coil assembly 60A and additional coil assembly 60C. Additional coil assembly 60C may be connected to magnetic back 40C.

Figure 13:
FIGS. 13-15 depict further embodiments of a magnet array arrangement in a stage system.
Figure 14:
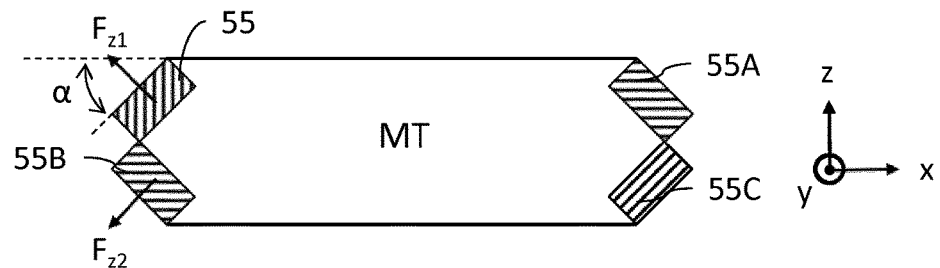
Figure 15:
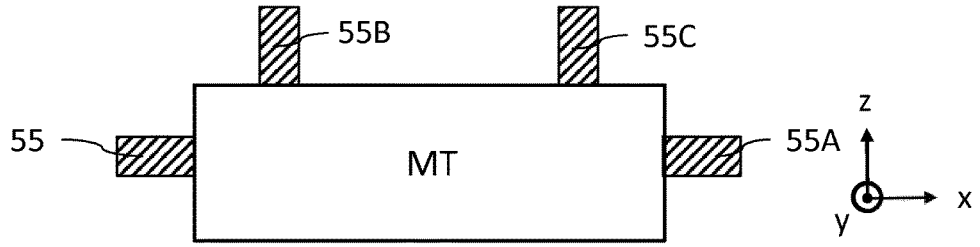

As depicted in FIG. 11, there is a single magnet array 55 and the surface of the magnet array 55 facing the coil assembly 60 is horizontal. As a result, the supporting force Fz is vertical. FIGS. 13-15 depict further arrangements of the magnet array 55 to provide the supporting force Fz in a different direction than vertical.

FIG. 13 shows the movable body of FIG. 11, but now with two magnet arrays, i.e., magnet array 55 and magnet array 55B, on one side of the movable body. Magnet array 55 is arranged to cooperate with the coil assembly 60 to create the driving force Fy and the supporting force Fz. Magnet array 55B is arranged to cooperate with coil assembly 60B to contribute to the driving force Fy and the supporting force Fz. On the other side of the movable body, there are magnet array 55A and 55C. Magnet array 55A is arranged to cooperate with coil assembly 60A to contribute to the further driving force Fy2 and the further supporting force Fz2. Magnet array 55C is arranged to cooperate with coil assembly 60c to contribute to the further driving force Fy2 and the further supporting force Fz2.

FIG. 14 shows magnet array 55 and magnet array 55B at an angle $\alpha$ with the top surface of the movable body. Instead of one supporting force Fz, there are two supporting forces, i.e., supporting force Fz1 and Fz2. Supporting force Fz1 is directed in the +z-direction and the −x-direction. Supporting force Fz2 is directed in the −z-direction and the −x-direction. By controlling the supporting forces Fz1 and Fz2, the movable body can be moved in both x-direction and z-direction. Depending on the angle $\alpha$, the direction of the supporting forces Fz1 and Fz2 can be set. The angle $\alpha$ may be 45 degrees, or 75 degrees, or any other suitable angle. In an alternative, only one of the magnet array 55 and magnet array 55B is at an angle $\alpha$. The other of the magnet array 55 and magnet array 55B may be horizontal. In this alternative, the one of the magnet array 55 or magnet array 55B that is at an angle $\alpha$ provides a supporting force Fz and a force in the x-direction, whereas as the other of the magnet array 55 or magnet array 55B that is horizontal provides a supporting force Fz and no force in the x-direction. The magnet arrays 55A and 55C may be arranged in a similar way as magnet arrays 55 and 55B.

FIG. 15 shows an embodiment in which the magnet array 55 is horizontally and the magnet array 55B at an angle of 90 degrees with the top surface of the movable body. In this embodiment, the supporting force Fz created by the magnet array 55B is directed only in the x-direction and is indicated with Fx. In case the x-direction is perpendicular to gravity, the force Fx does not support any weight of the movable body. Instead, the force Fx can be used to accelerate the movable body in the x-direction. The magnet arrays 55A and 55C may be arranged in a similar way as magnet arrays 55 and 55B.

Depending on the desired range of movement of the movable body, one of the embodiments of FIGS. 13-15 may be selected. For example, when a large range of movement in the x-direction is required, the embodiment of FIG. 13 may be beneficial, because the gaps between the magnet arrays 55,55B and respectively coil assemblies 60, 60C do not change. A high efficiency of the actuator 51 is achieved over the entire range of movement in the x-direction. The embodiments of FIGS. 14 and 15 may be beneficial if a substantial force in the x-direction is required. Because of the angle $\alpha$, the gaps between the magnet arrays 55,55B and respectively coil assemblies 60, 60C depend on both the x-position and the z-position of the movable body.

The embodiments of FIGS. 13-15 may be combined, for example by adding more than two magnet arrays 55, 55B onto the moveable body.

The coil assemblies 60-60C in the embodiments described above may be coupled to a balance mass BM. The coupling of the coil assemblies 60-60C may be directly to the balance mass or indirectly. An indirect coupling may be, for example, via the magnetic back 40-40C or some other component. The balance mass may absorb at least some of the reaction force due to the driving force Fy or the supporting force Fz by accelerating in a direction opposite to the direction in which the movable body accelerates. Typically, the balance mass has a larger mass than the movable body, for example 10 times or 100 times larger.

Figure 17:
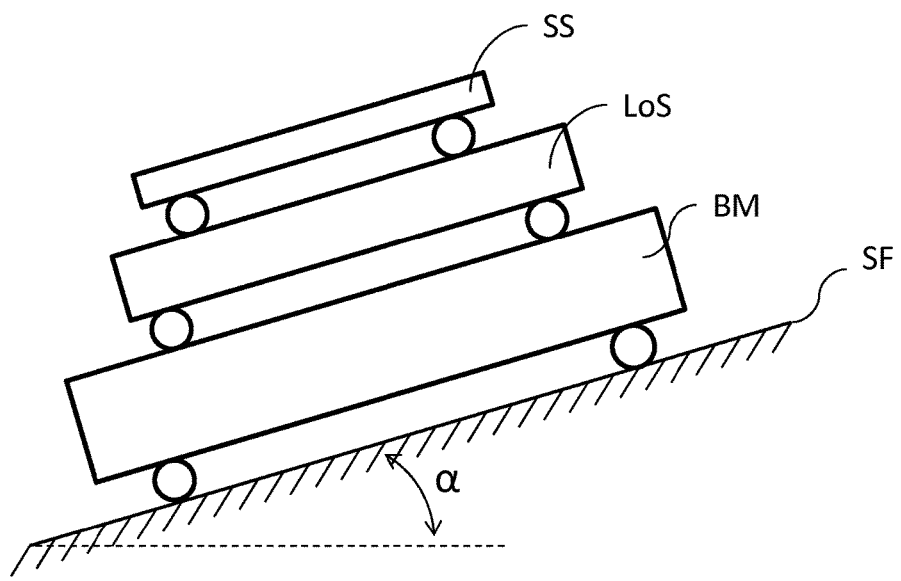
FIG. 17 depicts a tilted stage system.
Figure 18:
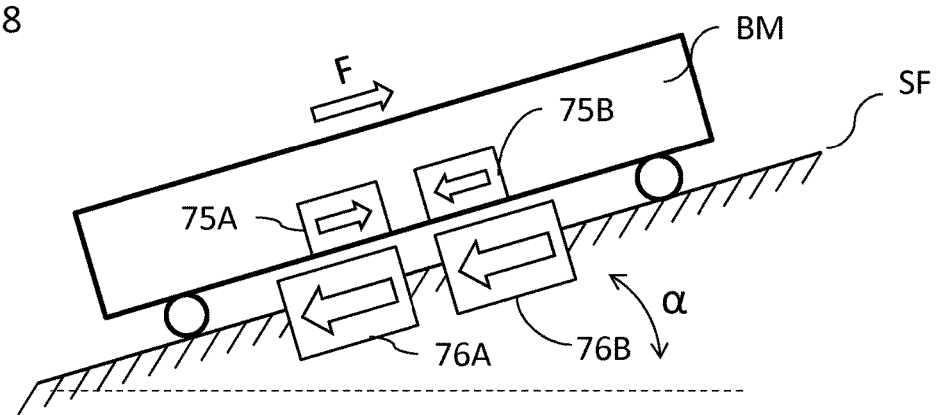
FIGS. 18-20 depict a tilted passive balance mass configuration.
Figure 19:
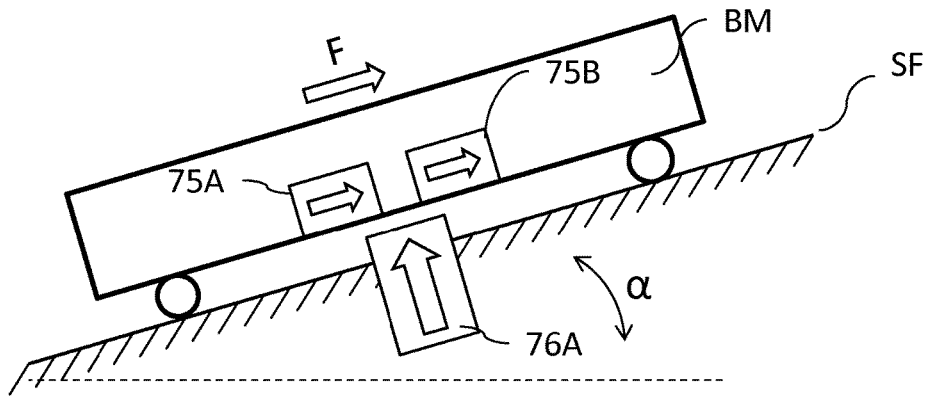
Figure 20:
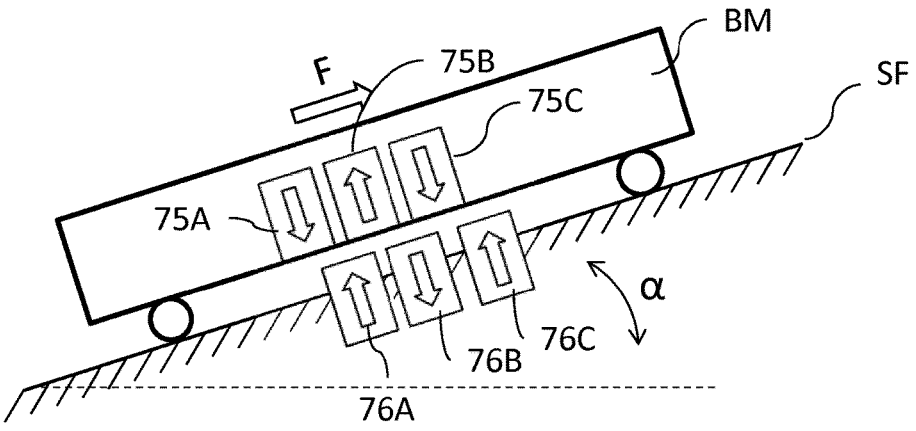

For specific applications it may be desirable to place the balance mass BM under an angle with respect to a supporting frame SF, i.e. the moving direction of the balance mass is not perpendicular to the gravitational direction. Such a balance mass configuration is referred to as 'a tilted balance mass'. An example of a mask support structure MT and a tilted balance mass under an angle α is shown in FIG. 17. The shown parts of the mask support structure are the short stroke SS, long stroke LoS and the balance mass BM. The functions of these parts have been explained above in the description. Such a configuration may however introduce a disadvantage in that a large power consuming actuator is required to overcome the gravitational load on the balance mass BM. As an example, if the mass of the balance mass BM equals 800 kg, and the angle α equals 30 degrees, the total gravitational load is about $F_{GC}=800 \cdot 10 \cdot \sin(30°)=2740$ N. Therefore it is desirable to introduce a passive system that is able to compensate for the gravitational load. Additionally a relatively small electromagnetic actuator (not shown) is added to the passive system to compensate for small force fluctuations (i.e. due to drifting) of the desired position of the balance mass. FIGS. 18-20 show examples of tilted passive balance mass configurations. In FIG. 18 a balance mass magnet system is connected to the balance mass BM. The balance mass magnet system comprises a first balance mass magnet system 75A having a first polarization direction and a second balance mass magnet system 75B having a second polarization direction, wherein the second polarization direction is substantially opposite to the first polarization direction. A supporting frame magnet system is connected to the supporting frame SF. The supporting frame magnet system comprises a first supporting frame magnet system 76A having a first polarization direction and a second supporting frame magnet system 76B having a substantially similar polarization direction as the first polarization direction. In an embodiment the polarization directions of the first and second supporting frame magnet system 76A, 76B are substantially equal to the second polarization direction of the second balance mass system 75B. By designing the correct dimension of the balance mass magnet system and the supporting frame magnet system, a passive force at about equal to the gravitational load may be obtained. FIGS. 19 and 20 show alternative embodiments of the balance mass magnet system (75A, 75B and 75A, 75B, 75C respectively) and the supporting frame magnet system (76A and 76A, 76B, 76C respectively), whereby the gravitational load on the balance mass can be corrected in a passive way.

In an embodiment, there is provided an actuator comprising: coil assemblies arranged in an array, wherein each coil assembly defines a core chamber having a core chamber height; and at least one magnetic member that extends partly along the core chamber height of the core chamber of a corresponding at least one coil assembly, wherein the at least one magnetic member is made of a magnetic material.

In an embodiment, at least one of a shape of the at least one magnetic member, a size of the at least one magnetic member, a position of the at least one magnetic member and the magnetic material of the at least one magnetic member is selected so as to select one or more parameters of the actuator. In an embodiment, the actuator comprises a magnetic back, wherein the coil assemblies are coupled to the magnetic back, and wherein the at least one magnetic member is spaced from the magnetic back. In an embodiment, the actuator comprises an isolation plate between the magnetic back and the at least one magnetic member. In an embodiment, the isolation plate is configured to electrically and/or thermally isolate the coil assemblies from the magnetic back. In an embodiment, the magnetic back is smaller than a horizontal extent of the coil assemblies such that at least one magnetic member is beyond the magnetic back. In an embodiment, the actuator comprises a magnetic back, wherein the coil assemblies are coupled to the magnetic back, and wherein the at least one magnetic member is part of the magnetic back. In an embodiment, the shape of the at least one magnetic member is selected such that the at least one magnetic member has a rounded surface facing away from the magnetic back. In an embodiment, each coil assembly comprises at least two sub-coils which are stacked and an intermediate plate between the at least two sub-coils, such that the core chamber of the coil assembly comprises a back core compartment and a front core compartment. In an embodiment, the back core compartment contains the magnetic member and the front core compartment does not contain any magnetic member. In an embodiment, the back core compartment is larger than the front core compartment. In an embodiment, the magnetic member is made of a soft magnetic material. In an embodiment, the soft magnetic material is selected from a group consisting of a cobalt-iron magnetic alloy, a nickel-iron magnetic alloy, pure iron, low-carbon steel and electrical steel. In an embodiment, the parameters include one or more of a steepness, a normal force, an inductance, a cogging force, a reluctance force, a K-factor ripple and a force density.

In an embodiment, there is provided a positioning device configured to position a component of a lithographic apparatus, wherein the positioning device comprises an actuator as described herein. In an embodiment, there is provided a lithographic apparatus comprising a positioning device as described herein.

In an embodiment, there is provided a method for manufacturing an actuator, the method comprising: defining a core chamber with each of a plurality of coil assemblies, wherein each core chamber has a core chamber height; arranging the coil assemblies in an array; and providing each core chamber with at least one magnetic member made of a magnetic material such that the magnetic member extends partly along the core chamber height of the core chamber.

In an embodiment, the method comprises comprising selecting at least one of a shape of the at least one magnetic member, a size of the at least one magnetic member, a position of the at least one magnetic member and the magnetic material of the at least one magnetic member so as to control one or more parameters of the actuator. In an embodiment, the method comprises coupling the coil assemblies to a magnetic back, such that the at least one magnetic member is spaced from the magnetic back. In an embodiment, the method comprises providing an isolation plate between the magnetic back and the at least one magnetic member so as to electrically isolate the coil assemblies from the magnetic back. In an embodiment, the method comprises manufacturing each magnetic member as a separate component from the magnetic back before the magnetic member and the magnetic back are combined in the actuator. In an embodiment, the method comprises providing an isolation plate and a closing plate at opposite ends of the at least one coil assembly so as to contain the at least one magnetic member within the core chamber. In an embodiment, the method comprises grinding the magnetic material to form the at least one magnetic member, thereby selecting at least one of a shape of the at least one magnetic member and a size of at least one magnetic member so as to control one or more parameters of the actuator. In an embodiment, the step of providing each core chamber with at least one magnetic member comprises integrating each magnetic member inside a corresponding coil assembly.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

ANNEX TO THE DESCRIPTION $$I(i, p, \varphi) = I_{peak} \sin\left[\frac{\pi * p}{\tau} + \varphi + \frac{4 * \pi}{3}(i - 0.5)\right] \quad \text{Eq (1)}$$

The invention claimed is:

1. An actuator comprising:
coil assemblies arranged in an array, wherein each coil assembly defines a core chamber having a core chamber height;
a magnetic back; and
at least one magnetic member that extends partly along the core chamber height of the core chamber of a corresponding at least one coil assembly, wherein the at least one magnetic member is made of a magnetic material;
wherein the coil assemblies are coupled to the magnetic back, and wherein the at least one magnetic member is spaced from the magnetic back.

2. The actuator of claim 1, wherein one or more selected from: a shape of the at least one magnetic member, a size of the at least one magnetic member, a position of the at least one magnetic member and/or the magnetic material of the at least one magnetic member, is selected so as to select one or more parameters of the actuator.

3. The actuator of claim 2, wherein the one or more parameters is one or more selected from: a steepness, a normal force, an inductance, a cogging force, a reluctance force, a K-factor ripple and/or a force density.

4. The actuator of claim 1, further comprising an isolation plate between the magnetic back and the at least one magnetic member.

5. The actuator of claim 4, wherein the isolation plate is configured to electrically and/or thermally isolate the coil assemblies from the magnetic back.

6. The actuator of claim 1, wherein the magnetic back is smaller than a horizontal extent of the coil assemblies such that at least one magnetic member is beyond the magnetic back.

7. The actuator of claim 1, wherein the at least one magnetic member is spaced from the magnetic back by an open gap.

8. The actuator of claim 1, wherein the shape of the at least one magnetic member is selected such that the at least one magnetic member has a rounded surface facing away from the magnetic back.

9. The actuator of claim 1, wherein each coil assembly comprises at least two sub-coils which are stacked and an intermediate plate between the at least two sub-coils, such that the core chamber of the coil assembly comprises a back core compartment and a front core compartment.

10. The actuator of claim 9, wherein the back core compartment contains the at least one magnetic member and the front core compartment does not contain any magnetic member.

11. The actuator of claim 10, wherein the back core compartment is larger than the front core compartment.

12. The actuator of claim 1, wherein the at least one magnetic member is made of a soft magnetic material.

13. The actuator of claim 12, wherein the soft magnetic material is selected from a group consisting of a cobalt-iron magnetic alloy, a nickel-iron magnetic alloy, pure iron, low-carbon steel and electrical steel.

14. A positioning device configured to position a component of a lithographic apparatus, wherein the positioning device comprises the actuator of claim 1.

15. A lithographic apparatus comprising the positioning device of claim 14.

16. A method for manufacturing an actuator, the method comprising:
providing a plurality of coil assemblies, each of the coil assemblies defining an associated core chamber and each core chamber having a core chamber height; and
coupling the coil assemblies in an array to a magnetic back, wherein each core chamber has at least one magnetic member made of a magnetic material such that the at least one magnetic member extends partly along the core chamber height of the core chamber and wherein the at least one magnetic member is spaced from the magnetic back.

17. The method of claim 16, comprising selecting one or more from: a shape of the at least one magnetic member, a size of the at least one magnetic member, a position of the at least one magnetic member and/or the magnetic material of the at least one magnetic member, so as to control one or more parameters of the actuator.

18. The method of claim 16, further comprising providing an isolation plate between the magnetic back and the at least one magnetic member so as to electrically isolate the coil assemblies from the magnetic back.

19. The method of claim 16, comprising manufacturing the at least one magnetic member as a separate component from the magnetic back before the at least one magnetic member and the magnetic back are combined in the actuator.

20. The method of claim 16, comprising providing an isolation plate and a closing plate at opposite ends of at least one coil assembly so as to contain the at least one magnetic member within the core chamber.

21. The method of claim 16, comprising grinding the magnetic material to form the at least one magnetic member, thereby selecting one or more of: a shape of the at least one magnetic member and/or a size of the at least one magnetic member, so as to control one or more parameters of the actuator.

22. The method of claim 16, wherein providing each core chamber with at least one magnetic member comprises integrating each magnetic member inside a corresponding coil assembly.

23. An actuator comprising:
coil assemblies arranged in an array, wherein each coil assembly defines a core chamber having a core chamber height, wherein each coil assembly comprises at least two sub-coils which are stacked and an intermediate plate between the at least two sub-coils, such that the core chamber of the coil assembly comprises a back core compartment and a front core compartment; and
at least one magnetic member that extends partly along the core chamber height of the core chamber of a corresponding at least one coil assembly, wherein the at least one magnetic member is made of a magnetic material.

24. The actuator of claim 23, wherein the back core compartment contains the at least one magnetic member and the front core compartment does not contain any magnetic member.

\* \* \* \* \*